(12) United States Patent
Lynch

(10) Patent No.: US 6,861,826 B2
(45) Date of Patent: Mar. 1, 2005

(54) TIMING CIRCUIT FOR SYNCHRONOUS DC/DC CONTROL TO REDUCE SYNCHRONOUS RECTIFIER BODY DIODE CONDUCTION

(75) Inventor: Brian Thomas Lynch, Brookline, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/403,496

(22) Filed: Mar. 31, 2003

(65) Prior Publication Data

US 2004/0189269 A1 Sep. 30, 2004

(51) Int. Cl.⁷ .............................................. G05F 1/613
(52) U.S. Cl. ................................... 323/224; 323/284
(58) Field of Search ............................... 323/224, 283, 323/284

(56) References Cited

U.S. PATENT DOCUMENTS 5,592,071 A * 1/1997 Brown ........................ 323/282
5,757,173 A * 5/1998 Agiman ...................... 323/282
6,396,250 B1 5/2002 Bridge

* cited by examiner

Primary Examiner—Shawn Riley
(74) Attorney, Agent, or Firm—W. Daniel Swayze, Jr.; W. James Brady; Frederick J. Telecky, Jr.

(57) ABSTRACT

A control device and method for synchronizing activation and deactivation of a high-side switch (102) and a low-side switch (104) in a converter including an input (421) for receiving a reference signal from a signal generator and circuitry (400) coupled to the input and responsive to the reference signal for providing a control signal (422) for the high-side switch (102) having a constant pulse width corresponding the pulse width of the reference signal, and for providing a control signal (423) for the low-side (104) switch having a pulse width which is modulated on both the trailing edge and leading edge thereof for providing synchronization between activation and deactivation of the high-side switch (102) and the low-side switch (104) via the respective control signals.

19 Claims, 3 Drawing Sheets

TIMING CIRCUIT FOR SYNCHRONOUS DC/
DC CONTROL TO REDUCE SYNCHRONOUS
RECTIFIER BODY DIODE CONDUCTION

FIELD OF THE INVENTION

The present invention relates to the field of power supplies and, more particularly, to a timing control device for converters and switching regulators.

BACKGROUND OF THE INVENTION

Switching regulators, including ripple regulators, are commonly used because of their characteristic of high efficiency and high power density resulting from smaller magnetic, capacitive, and heat sink components. In current-mode control, for example, switching regulators indirectly regulate an average DC output voltage by selectively storing energy by switching energy on and off in an inductor. By comparing the output voltage to a reference voltage, the inductor current is controlled to provide the desired output voltage.

Synchronous buck power stages are a specific type of switching regulator that use two power switches such as power MOSFET transistors. A high-side switch selectively couples the inductor to a positive power supply while a low-side switch selectively couples the inductor to ground reference. A pulse width modulation (PWM) control circuit is used to control the high-side and low-side switches. Synchronous buck regulators provide high efficiency when low on-resistance power MOSFET devices are used.

With increased demand for low voltage power, the synchronous rectifier (SR) is an important circuit element in the DC-DC converter mainstream. One such use of the synchronous rectifier is the low-side switch in buck power stages.

The added emphasis on synchronous rectification is also posing design problems for the DC-DC converter designer. Typical SR design considerations include gate timing control, gate driver, and reverse conduction. For example, significant power losses can result from the delay necessary for switching on states between the high side and low side to prevent the simultaneous conduction of the high-side and the low-side switches. To maximize power efficiency, it is desirable to minimize the delay times to an optimal level, while preventing simultaneous cross-conduction of the high-side and low-side switches and output error.

SUMMARY

The present invention achieves technical advantages as an apparatus, system and method for synchronizing activation and deactivation of a high-side switch and a low-side switch in a converter. In one example, the present invention includes an input for receiving a reference signal from a signal generator in which the reference signal is a recurring pulse signal, and circuitry coupled to the input and responsive to the reference signal providing a first control signal having a constant pulse width, and providing a second control signal having a pulse width modulated on both the trailing and leading edges thereof providing synchronization with the first control signal pulse width, wherein the first control signal is provided for activation and deactivation of the high-side switch and the second control signal is provided for activating and deactivating said low-side switch.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1A:
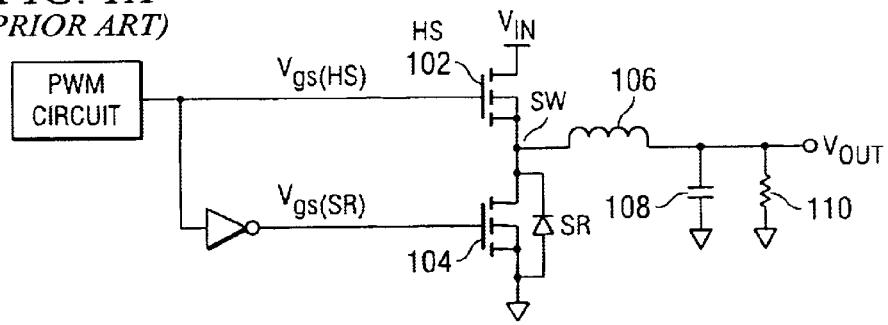
FIGS. 1A and 1B illustrate conventional synchronous rectifier circuits.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Referring to FIG. 1A there is illustrated a conventional synchronous rectifier buck converter which includes a high-side (HS) switch 102 and a low-side switch 104 implemented as a synchronous rectifier (herein referred to as the SR switch 104). The HS switch 102 is driven by gate drive signal $V_{GS}$ supplied by the pulse width modulation control circuit (hereinafter referred to as PWM) which is supplied to the gate with respect to the source of the HS switch 102. Likewise, an inverted PWM signal (i.e., gate drive signal $V_{GS}$) is applied to the gate of the SR switch 104. Further, a first terminal of an inductor 106 is connected to node SW and the second terminal to capacitor 108, with the other end of the capacitor 108 being connected to ground. Additionally, connected to the second end of inductor 106 is a resistor 110 with the other end of the resistor 110 being connected to ground. The resistor 110 represents the load of the buck circuit.

Figure 1B:
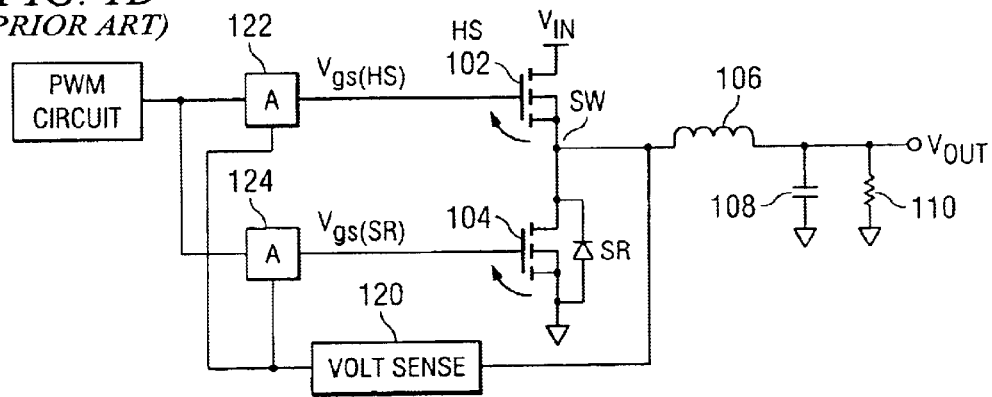

In an effort to reduce simultaneous conduction of switches 102 and 104 with little delay between respective $V_{GS}$, at least one approach uses sensed voltage on the output side of the converter circuit to provide an indication of how to adjust the PWM pulse to generate respective $V_{GS}$ signals. Such an approach, as illustrated in FIG. 1B and further described in, Bridge, U.S. Pat. No. 6,396,250 which is hereby incorporated by reference, implements a sensing circuit 120 in combination with pulse adjustment units 122 and 124. Here, the SW voltage is sensed at 120 and this information is used by the adjustment units 122 and 124 to delay the PWM pulses to each of the HS switch gate and the SR switch gate.

Figure 2:
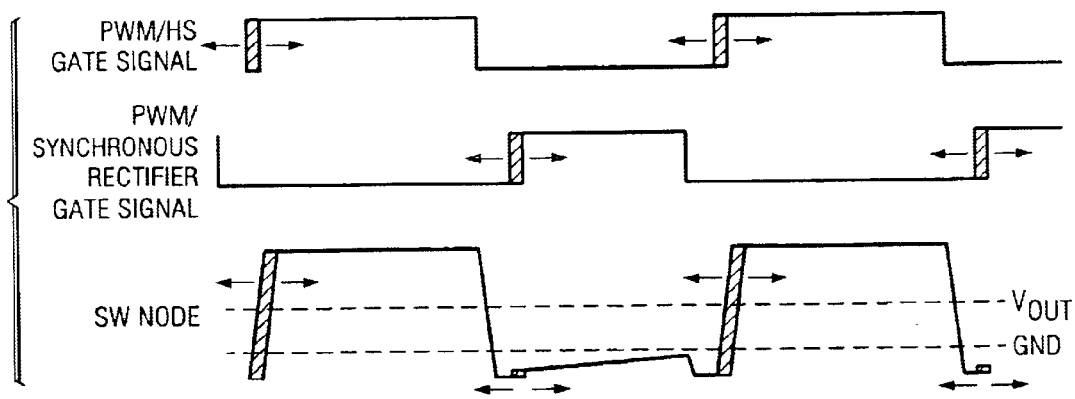
FIG. 2 shows a signal timing diagram in accordance with the circuit of FIG. 1B.

As shown in FIG. 2, the adjustment unit 122 uses an algorithm which adjusts the leading edge of the PWM pulses to the HS switch for generating the HS $V_{GS}$ and adjustment unit 124 uses an algorithm which adjusts the leading edge of the PWM pulses to the SR switch for generating the SR $V_{GS}$. More specifically, the timing between the SR $V_{GS}$ OFF and the HS $V_{GS}$ ON is adjusted by varying the timing of the HS $V_{GS}$ ON, and the timing between the HS $V_{GS}$ OFF and the SR $V_{GS}$ ON is adjusted by varying the timing of the SR $V_{GS}$ ON, as shown by the darken lines.

The voltage at node SW as it relates to the gate signal timing is also shown in FIG. 2. As can be seen, a variable ON time pulse width for the HS switch produces a corresponding variable voltage pulse width at node SW and, thus, a variation in the voltage time (v-μs) across inductor 106 which causes a variance in the duty cycle and error in $V_{out}$. Further, at light loads $V_{out}$ oscillates as the voltage sense feedback loop fights the gate drive circuits.

Figure 3:
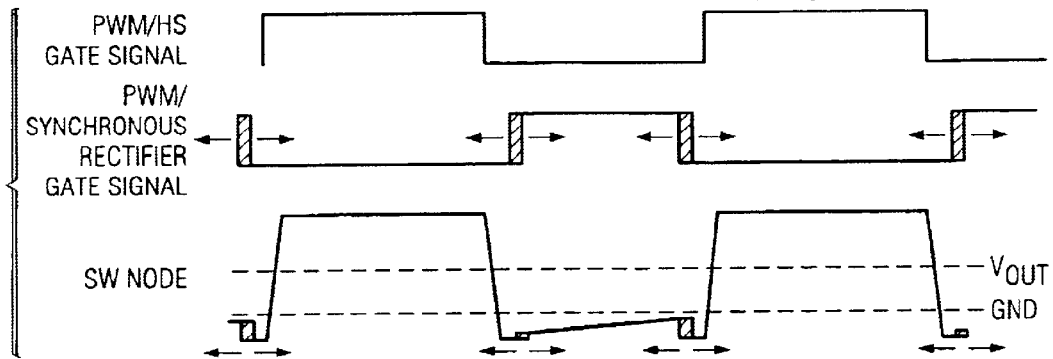
FIG. 3 shows a signal timing diagram in accordance with exemplary embodiments of the present invention.

Referring now to FIG. 3 there is illustrated timing pulses as provided in accordance with embodiments of the present invention in which the PWM reference pulse width is left unaffected with respect to the generated HS $V_{GS}$. Notice the timing between SR switch OFF and HS switch ON, and between HS switch OFF and SR switch ON is provided by adjusting both the leading and trailing edge of the PWM pulse for generating SR $V_{GS}$, such that the pulse width of the HS $V_{GS}$ remains consistent with that of the PWM pulse. A constant HS $V_{GS}$ pulse width reduces or eliminates the v-μs variation across inductor 106 caused by irregular HS switch ON times, advantageously reducing circuit noise and/or reducing feedback loop/SR gate timing loop interaction.

Figure 4:
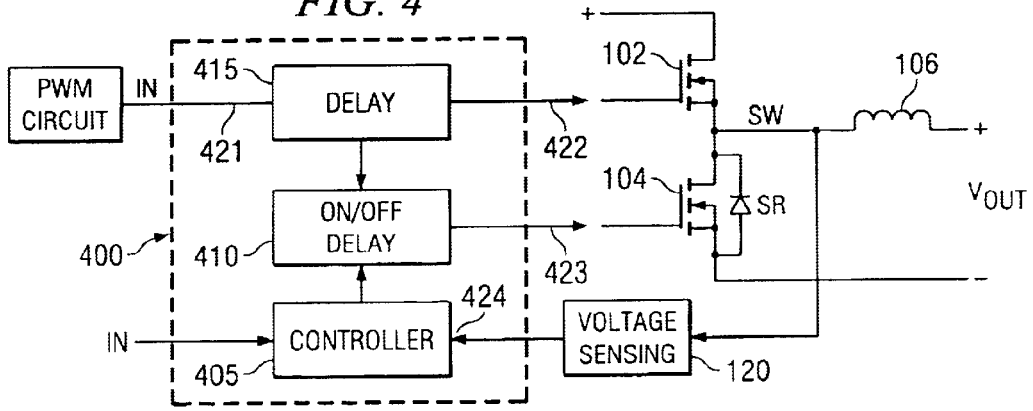
FIG. 4 illustrates a block diagram of a timing control circuit for a synchronous rectifier in accordance with exemplary embodiments of the present invention.
Figure 6:
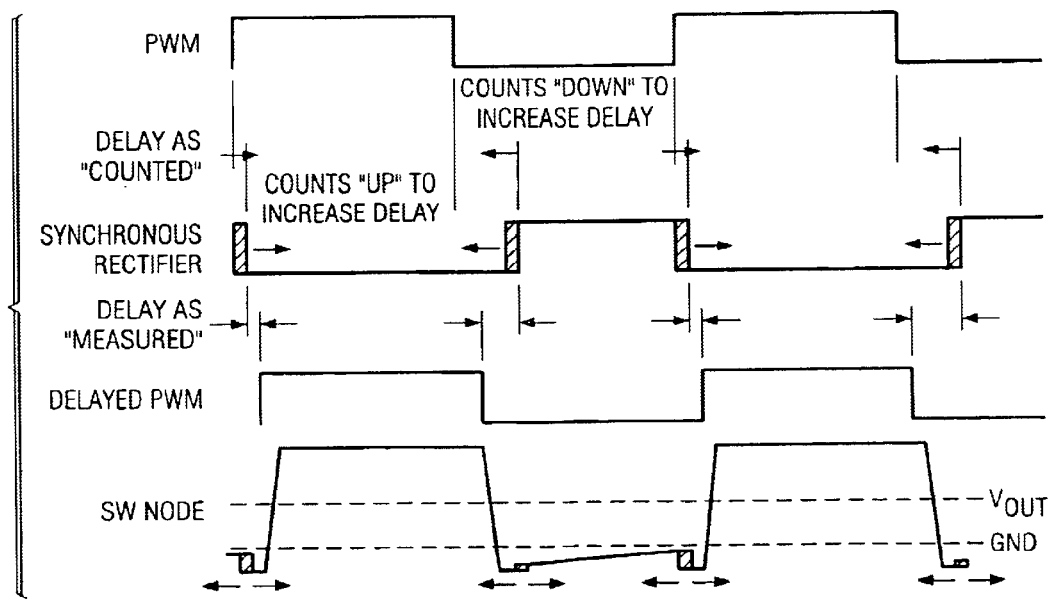
FIG. 6 shows signal timing diagram in accordance with the timing control circuit illustrated in FIG. 4.

Referring now to FIG. 4 there is illustrated a block diagram of a timing control circuit 400 for providing HS $V_{GS}$ and SR $V_{GS}$ signals, such as that shown in FIGS. 3 and 6, in a synchronous rectifier converter in accordance with exemplary embodiments of the present invention. In timing control circuit 400, the HS switch 102 (i.e., high-side power MOSFET) is connected in a series with the SR switch 104 (i.e., low-side power MOSFET) at node SW. In parallel with the SR switch 104 is diode SR. Diode SR can represent the MOSFET intrinsic body diode or a discrete device. In many DC/DC converter applications, current is allowed to flow through the intrinsic body diode as if it were a physical device. In other applications, a discrete device is added externally. For example, a reason a device may be added externally is that a body diode typically has a voltage drop of about 1 volt. A Schottky diode has a voltage drop that is typically 300 mv to 500 mv, so the losses during the diode conduction time are less with a Schottky than with just a body diode. There are other known tradeoffs, such as in switching losses, which may make the use of an external diode less attractive.

The voltage sensing circuit 120 is connected between the HS switch 102 and the SR switch 104. A delay 415 includes an input 421 connected to the PWM for receiving the PWM signal, and an output 422 for providing an HS $V_{GS}$ to the HS switch gate. A controller 405 is coupled with the voltage sensing circuit 120 at input 424 and responsive to the voltage response determines whether there has been body diode conduction for selecting a less or more delayed signal to pass through to the output. The controller 405 is also connected to a programmable ON/OFF delay 410 and is further coupled to receive the input signal from the PWM control circuit. The ON/OFF delay 410 is further connected to delay 415 for receiving a delayed PWM signal and includes an output 432 for providing an SR $V_{GS}$ to the SR switch gate.

Turning now to the operation associated with the circuit 400 of FIG. 4, the PWM signal is input to delay 415 which delays the signal to give a "look ahead" indicator, by providing a delay to the PWM wave form, gate signals are made available such that the trailing edge of the signal to the SR switch 104 can be adjusted directly. The rising and falling edges of the PWM pulse carry the timing information required to turn ON and OFF HS switch 102. In order to minimize the timing delay as seen by the SW node, SR $V_{GS}$ should begin to transition before, or at the same time as HS $V_{GS}$. Since there is inherent timing delay in any electronic circuit, a means is required for SR $V_{GS}$ to "anticipate" when it should transition from low to high or high to low. That means is provided by delaying HS $V_{GS}$ from the PWM pulse and the timing delay of SR $V_{GS}$ from the PWM pulse so that the resulting time delay from HS $V_{GS}$ to SR $V_{GS}$ and SR $V_{GS}$ to HS $V_{GS}$ results in minimum SR body diode conduction at SW. In this way, the circuit "looks ahead" to the timing required.

The delay 415 further sends the delayed PWM signal (i.e., HS $V_{GS}$) as an input to the HS switch 102 and to the ON/OFF delay 410. That is, in order to adequately minimize the timing delay between the turn OFF of the HS switch and turn ON of the SR, and conversely, the turn OFF of the SR and the turn ON of the HS switch, the two gate drive signals should actually overlap in time. That is, to minimize the time delay as seen at the SW node, the turn ON of one switch may have to occur earlier than the turn OFF of the other.

The ON/OFF delay 410 inverts the received HS $V_{GS}$ signal and adjust both the leading and trailing edges of the pulses (for adjusting the timing between SR switch OFF and HS switch ON, and between HS switch OFF and SR switch ON, as above-described), in accordance with an amount that is determined by the controller 405. The ON/OFF delay 410 outputs the inverted adjusted signal (i.e., the SR $V_{GS}$) signal to the SR switch 104, and the SR switch 104 conducts in accordance with the SR $V_{GS}$ to generate a reduced voltage $V_{OUT}$. After the HS switch 102 has finished conducting, a delay period occurs before the ON/OFF delay 410 operates the SR switch 104. The voltage sensor 120 senses the body diode conduction by, for example, measuring the voltage between the HS switch 102 and the SR switch 104. This measured voltage is compared with a reference voltage, and a compared voltage is generated, and the compared voltage activates the controller 405 for determining modulation of the trailing and leading edges for only the SR $V_{GS}$. In addition to the above-described direct sensing of body diode conduction, body diode conduction can be inferred by the state of the SW node before it transitions below ground reference (i.e., zero volts). For example, as described in the Bridge Patent, the fall of the SW node and the rise of the SR gate 423 is measured to infer there was body diode conduction of the falling edge of the SW node, and where body diode conduction is measured directly before the SW node rises.

Referring now to FIG. 6 there is shown a more detailed signal timing diagram which illustrates the above-described "look ahead" feature. From top to bottom, the signals in FIG. 6 (as they relate to the earlier figures) are: PWM 421; SR $V_{GS}$; HS $V_{GS}$ and SW.

Starting from the bottom left hand portion of FIG. 6, it should be clear the turn OFF of the SR is being modulated. It should also be clear that SR $V_{GS}$ must transition from high to low before HS $V_{GS}$ transition from low to high. Keeping in mind that one of the criteria of the circuit is to maintain the pulse width integrity from PWM 421 to HS $V_{GS}$, then the circuit transitions SR $V_{GS}$ within the time period between the high to low transition of PWM 421 and the high to low transition of HS $V_{GS}$. The control circuit 400 adjusts the delay time from the high to low transition of PWM 421 and the low to high transition of SR $V_{GS}$ so that the resulting time delay between the SR $V_{GS}$ transition and the HS $V_{GS}$ transition results in minimum body diode conduction at SW.

The "delay as counted" line depicts the delay time as counted by the control circuit 400 which is internal to the circuit. The "delay as measured" indicates the time delay as is measured at the SW node. The same approach applies to the second timing interval, where the PWM signal transitions from high to low. This portion operates in a similar manner, however the SR $V_{GS}$ does not need to transition as far forward in time as the earlier case.

Figure 5:
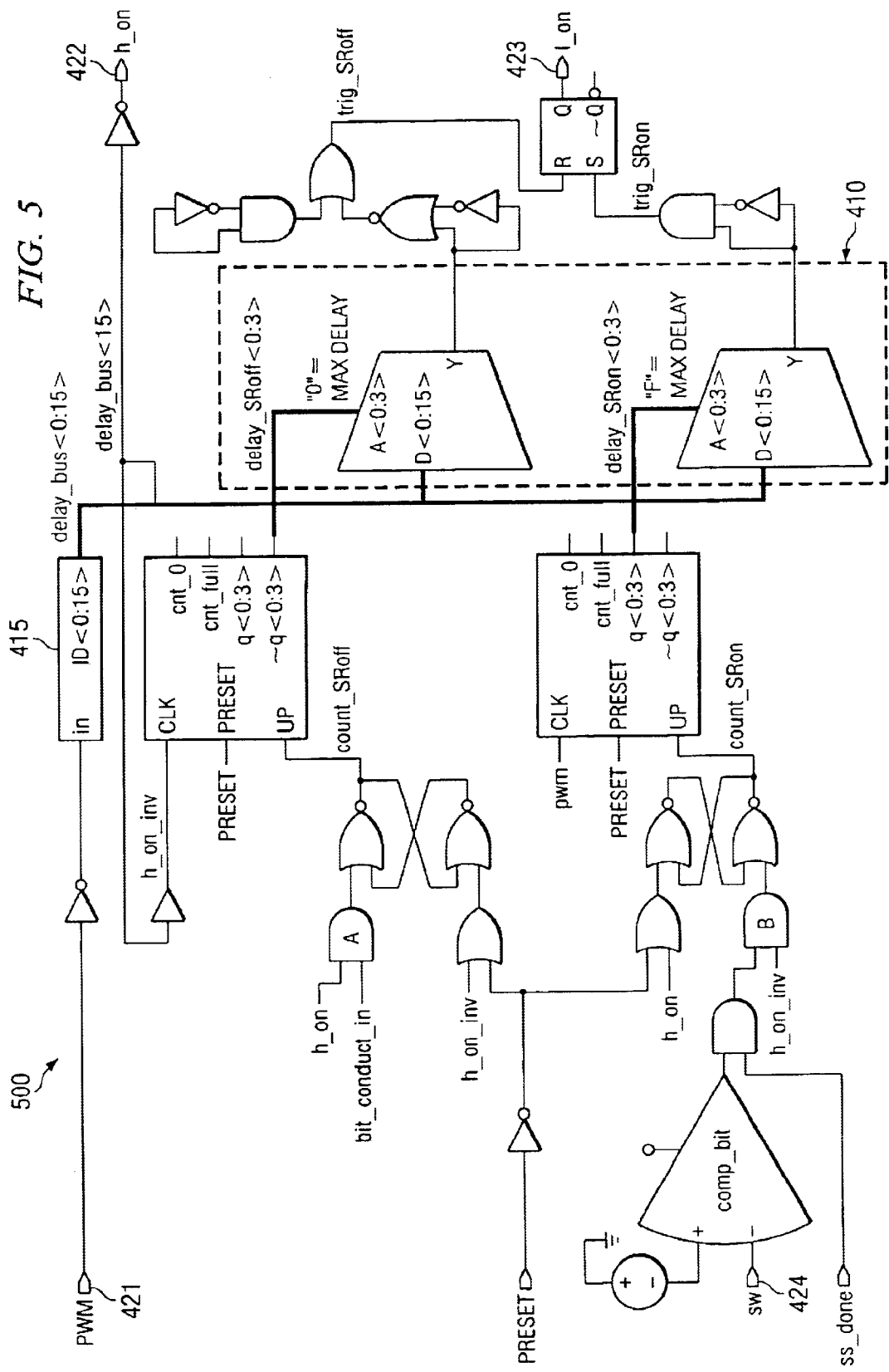
FIG. 5 shows a digital circuit for implementing the timing control circuit illustrated in FIG. 4.

Referring now to FIG. 5 there is shown a circuit 500 for implementing the timing control circuit 400 illustrated in FIG. 4. The circuit 500 is a digital implementation although an analog implementation is also contemplated. The items 410 and 415 generally correspond to the ON/OFF Delay 410 and Delay 415, respectively, as shown in FIG. 4. The remainder of the circuit generally corresponds to the controller 405.

The shown preset and ss_done signal inputs illustrate further details. The preset signal is used to initialize the delay circuit on startup so that the delays are set to "maximum". This insures the circuit starts in a known, safe state on power up. In conventional PWM controllers, there is a means to gradually increase the converter's output voltage from zero to the regulation voltage when power is applied. In the industry, this is called soft-start. In this implementation, the timing circuit is prevented from updating the timing delays until the converter reaches regulation voltage. The ss_done signal is used to indicate soft start has been completed, and the output is in regulation. In other implementations, the timing circuit is allowed to update the delays during the startup process.

Although exemplary embodiments of the invention are described above in detail, this does not limit the scope of the invention, which can be practiced in a variety of embodiments.

What is claimed is:

1. An apparatus for providing switch signaling in a converter system which includes a signal generator, and a high-side transistor switch and a low-side transistor switch implemented as a synchronous rectifier coupled in series at a node, said apparatus comprising:

an input for receiving a reference signal from said signal generator, wherein said reference signal is a recurring pulse signal;

circuitry coupled to said input and responsive to said reference signal providing a first control signal having a constant pulse width, and providing a second control signal being independent of said high-side transistor switch and having a pulse width modulated on both the trailing and leading edges thereof providing synchronization with said first control signal pulse width, wherein said first control signal is provided to a gate of said high-side transistor switch for activating and deactivating said high-side switch and said second control signal is provided to a gate of said low-side transistor switch for activating and deactivating said low-side switch.

2. The apparatus of claim 1, wherein said first control signal corresponds to said reference signal and said second control signal corresponds to an inverted reference signal, wherein both the trailing edge and the leading edge of the pulses of said inverted reference signal are modulated providing synchronization between activation and deactivation of said high-side switch and said low-side switch via said first control signal and said second control signal, respectively.

3. The apparatus of claim 2, wherein the trailing edge for said second control signal pulse is modulated to coordinate timing between deactivating said low-side switch and activating said high-side switch and the leading edge for said second control signal pulse is modulated to coordinate timing between deactivating said high-side and activating said low-side switch.

4. The apparatus of claim 1, wherein said first control signal and said second control signal are cooperatively provided for enabling a voltage response at said node having a constant pulse width.

5. The apparatus of claim 1, wherein said first control signal pulse width is equal to the pulse width of said reference signal.

6. The apparatus of claim 1 further including a delay device having an input for receiving said first control signal and responsive thereto for providing said second control signal by inverting said first control signal and modulating both the trailing and leading edges of the pulses of said inverted first control signal.

7. The apparatus of claim 6 further including a controller having an input for receiving a voltage response for said node and responsive thereto for determining the magnitude of the trailing edge and leading edge modulation based on whether there is body diode conduction.

8. The apparatus of claim 7, wherein the trailing edge for said second control signal pulse is modulated by a corresponding determined magnitude to coordinate timing between deactivating said low-side switch and activating said high-side switch and the leading edge for said second control signal pulse is modulated by a corresponding determined magnitude to coordinate timing between deactivating said high-side and activating said low-side switch.

9. A system for providing switch signaling in a converter having a high-side switch for coupling a node to a first voltage and a low-side switch implemented as a synchronous rectifier for coupling said node to a reference voltage, said system comprising:

a pulse width modulator (PWM) having an output for providing a recurring reference signal; and circuitry coupled to said PWM and responsive to said reference signal providing a first control signal having a fixed pulse width, and providing a second control signal being independent of said high-side switch and having a pulse width modulated on both the trailing and leading edges thereof providing synchronization with said first control signal pulse width, said first control signal is provided for activating and deactivating said high-side switch and said second control signal in provided for activating and deactivating said low-side switch.

10. The system of claim 9, wherein said first control signal pulse width corresponds to the pulse width of said reference signal and said second control signal corresponds to an inverted reference signal, wherein both the trailing edge and the leading edge of the pulses of said inverted reference signal are modulated providing synchronization between activation and deactivation of said high-side switch and said low-side switch via said first control signal and said second control signal, respectively.

11. The system of claim 10, wherein the trailing edge for said second control signal pulse is modulated to coordinate timing between deactivating said low-side switch and activating said high-side switch and the leading edge for said second control signal pulse is modulated to coordinate timing between deactivating said high-side and activating said low-side switch.

12. The system of claim 9, wherein said first control signal and said second control signal are cooperatively provided for enabling a voltage response at said node having a constant pulse width.

13. The system of claim 9, wherein said first control signal pulse width is fixed to the pulse width of said reference signal.

14. The system of claim 9 further including a delay device having an input for receiving said first control signal and responsive thereto for providing said second control signal by inverting said first control signal and modulating both the trailing and leading edges of the pulses of said inverted first control signal.

15. The system of claim 9 further including a controller having an input for receiving a voltage response for said node and responsive thereto for determining the magnitude of the trailing edge and leading edge modulation.

16. The system of claim 9, wherein the trailing edge for said second control signal pulse is modulated by a corresponding determined magnitude to coordinate timing between deactivating said low-side switch and activating said high-side switch and the leading edge for said second control signal pulse is modulated by a corresponding determined magnitude to coordinate timing between deactivating said high-side and activating said low-side switch.

17. A method for synchronizing activation and deactivation of a high-side switch and a low-side switch in a converter, said method comprising:

providing a reference signal having a recurring pulse;

generating a first control signal having a fixed pulse width corresponding to the pulse width of said reference signal, said first control signal provides for activating and deactivating said high-side switch; and inverting said first control signal for providing a second control signal, said second control signal provides for activating and deactivating said low-side switch;

modulating both the trailing and leading edges of the pulses of said second control signal being independent of said high-side switch and for providing synchronization with said first control signal pulse width.

18. The method of claim 17 further including modulating the trailing edge to coordinate timing between deactivating said low-side switch and activating said high-side switch and modulating the leading edge coordinate timing between deactivating said high-side and activating said low-side switch.

19. The method of claim 17, wherein said first control signal pulse width is fixed to the pulse width of said reference signal.

* * * * *